(12) United States Patent
Jang et al.

(10) Patent No.: US 10,355,684 B2
(45) Date of Patent: Jul. 16, 2019

(54) CALCULATION CODE GENERATION CIRCUIT AND DIGITAL CORRECTION CIRCUIT INCLUDING THE SAME

(71) Applicants: SK hynix Inc., Icheon (KR); KUMOH NATIONAL INSTITUTE OF TECHNOLOGY INDUSTRY-ACADEMIC COOPERATION FOUNDATION, Gumi (KR)

(72) Inventors: Young Chan Jang, Gumi (KR); Pil Ho Lee, Daegu (KR); Kwang Hun Lee, Icheon (KR); Hyun Bae Lee, Icheon (KR)

(73) Assignees: SK HYNIX INC, Icheon (KR); KUMOH NATIONAL INSTITUTE OF TECHNOLOGY INDUSTRY-ACADEMIC COOPERATION FOUNDATION, Gumi (KR)

( * ) Notice: Subject to any disclaimer, the term of this patent is extended or adjusted under 35 U.S.C. 154(b) by 0 days.

(21) Appl. No.: 15/657,005

(22) Filed: Jul. 21, 2017

(65) Prior Publication Data

US 2018/0183420 A1 Jun. 28, 2018

(30) Foreign Application Priority Data

Dec. 26, 2016 (KR) .......................... 10-2016-0179266

(51) Int. Cl.
 *H03K 5/24* (2006.01)

(52) U.S. Cl.
 CPC ....................................... *H03K 5/24* (2013.01)

(58) Field of Classification Search
 CPC .......... G01R 23/00; G01R 23/10; G05B 9/00; G05B 9/03; G06F 1/00; G06F 1/3218;
 (Continued)

(56) References Cited

U.S. PATENT DOCUMENTS 6,356,218 B1* 3/2002 Brown ................ H03M 1/1019
 341/120
9,052,730 B2 6/2015 Chen et al.
 (Continued)

FOREIGN PATENT DOCUMENTS

KR 10-1341642 B1 12/2013

*Primary Examiner* — Lincoln D Donovan
*Assistant Examiner* — Dave Mattison

(57) ABSTRACT

A calculation code generation circuit performs calibration using a counter, and a digital correction circuit including the same. The calculation code generation circuit performs a calculation process according to first and second modes, the calculation process including generating a first code by sampling a first value of the count code, generating a second code by sampling a second value of the count code, generating first and second calculation codes using the first and second codes in the first and second modes, respectively, and generating, in a calibration disable state, a third calculation code using the first and second calculation codes generated in the first and second modes, respectively, to remove the influence of the comparison offset or comparison performance of a comparator, thereby removing a calibration error.

18 Claims, 6 Drawing Sheets

(58) Field of Classification Search
CPC .. G06F 7/00; G06F 7/62; H03K 21/00; H03K 5/24
USPC .......................................................... 377/27
See application file for complete search history.

(56) References Cited

U.S. PATENT DOCUMENTS

| | | | |
|---|---|---|---|
| 2008/0191671 A1* | 8/2008 | Shikata .................... | G05F 1/56 323/273 |
| 2011/0279297 A1* | 11/2011 | Oettinger ................ | H03M 1/20 341/122 |
| 2014/0097816 A1* | 4/2014 | Chen ........................ | G05F 1/468 323/283 |
| 2015/0171834 A1* | 6/2015 | Arp ......................... | H03K 5/1565 327/175 |

* cited by examiner

CALCULATION CODE GENERATION CIRCUIT AND DIGITAL CORRECTION CIRCUIT INCLUDING THE SAME

CROSS-REFERENCE TO RELATED APPLICATIONS

The present application claims priority to Korean Patent Application No. 10-2016-0179266, filed on Dec. 26, 2016, which is incorporated herein by reference in its entirety.

BACKGROUND

1. Field

Exemplary embodiments of the present disclosure relate to digital correction technology, and more particularly, to a calculation code generation circuit capable of performing calibration using a counter, and a digital correction circuit including the calculation code generation circuit.

2. Description of the Related Art

A correction circuit to perform calibration is used to compensate for a mismatch between circuits or to optimize a specific signal.

An analog correction circuit includes a current pump and a capacitor, but may generate errors that are increased by noise and discharge of the capacitor.

Recently, a digital correction circuit using a counter has been proposed in order to prevent errors generated by the analog correction circuit. However, since a general digital correction circuit is implemented with a comparison circuit, an error may also occur due to the performance and offset of a comparator included in the comparison circuit.

Specifically, the digital correction circuit has a problem in that an error occurs because the control resolution of a control voltage is limited by the comparison performance of the comparator.

For example, when the control resolution of the control voltage is lower than the comparison performance of the comparator, e.g., when the control resolution of the control voltage is 0.5 mV and the comparison performance of the comparator is 1 mV, the counter can output five digital codes at a constant cycle after calibration. According to a point of time when a correction mode ends, the digital correction circuit may reflect one of the five digital codes into the calibration.

That is, since the digital correction circuit does not reflect an optimal value corresponding to the control resolution into the calibration result due to the comparison performance of the comparator, an error may occur. As the calibration is repeatedly performed, errors may be increased.

Furthermore, the comparison offset of the comparator in the digital calibration circuit may increase errors.

SUMMARY

Various embodiments are directed to a calculation code generation circuit capable of removing a limitation in control resolution of a control voltage, the limitation being caused by the comparison performance of a comparator configured for calibration, and a digital correction circuit including the same.

Also, various embodiments are directed to a calculation code generation circuit capable of removing an error, which is caused by a comparison offset of a comparator configured for calibration, and a digital correction circuit including the same.

In an embodiment, a digital correction circuit may include: a comparison circuit suitable for comparing a reference voltage and a control voltage of a calibration circuit in a calibration enable state, the reference voltage and the control voltage being compared in a non-inverted state in a first mode, the reference voltage and the control voltage being compared in an inverted state in a second mode, the comparison circuit being suitable for generating a comparison signal depending on whether the first or second mode is enabled; a count code generation circuit suitable for generating a count code by performing a counting operation on the comparison signal in the calibration enable state, for generating a detection signal indicating whether the count code deviates from a preset range, and for stopping the counting operation in response to the detection signal when the count code deviates from the preset range; a calculation code generation circuit suitable for performing a calculation process according to the first and second modes, the calculation process including: generating a first code by sampling a first value of the count code when the value of the count code satisfies a first preset condition; generating a second code by sampling a second value of the count code when the value of the count code satisfies a second preset condition; generating first and second calculation codes using the first and second codes in the first and second modes, respectively; generating, in a calibration disable state, a third calculation code using the first and second calculation codes generated in the first and second modes, respectively; and a code selection circuit suitable for providing the count code as a control code in the calibration enable state, and for providing the third calculation code as the control code in the calibration disable state.

In an embodiment, a calculation code generation circuit may include: a sampler suitable for receiving a count code generated by a counting operation performed based on a comparison signal, which is obtained by comparing, by a comparator, a control voltage outputted from a calibration circuit to a reference voltage; for generating a first code by sampling a first value of the count code that satisfies a first preset condition; and for generating the second code by sampling a second value of the count that satisfies a second preset condition; a switching circuit suitable for transmitting the first and second codes as first and second inputs in a calibration enable state, and for transmitting first and second calculation codes as the first and second inputs in a calibration disable state; a calculator suitable for generating the first and second calculation codes in the calibration enable state, and for generating a third calculation code in the calibration disable state, using the first and second inputs; a calculation storage circuit suitable for storing the first calculation code and the second calculation code in the calibration enable state, the first calculation code being generated in a first mode, the second calculation code being generated in a second mode; and a calculation controller suitable for controlling the calculation storage circuit to store the first calculation code in the first mode and for controlling the calculation storage circuit to store the second calculation code in the second mode, in the calibration enable state.

According to the present embodiments, the digital correction circuit and the calculation code generation circuit can remove the influence of a comparison performance or comparison offset of the comparator which limits the accuracy during a digital correction process for calibration, thereby providing the optimized calibration result.

Furthermore, the digital correction circuit and the calculation code generation circuit can correct an error caused by the comparison performance or comparison offset of the comparator, thereby reducing a load in configuring a comparison circuit for performing digital correction at high resolution for calibration.

DETAILED DESCRIPTION

Figure 1:
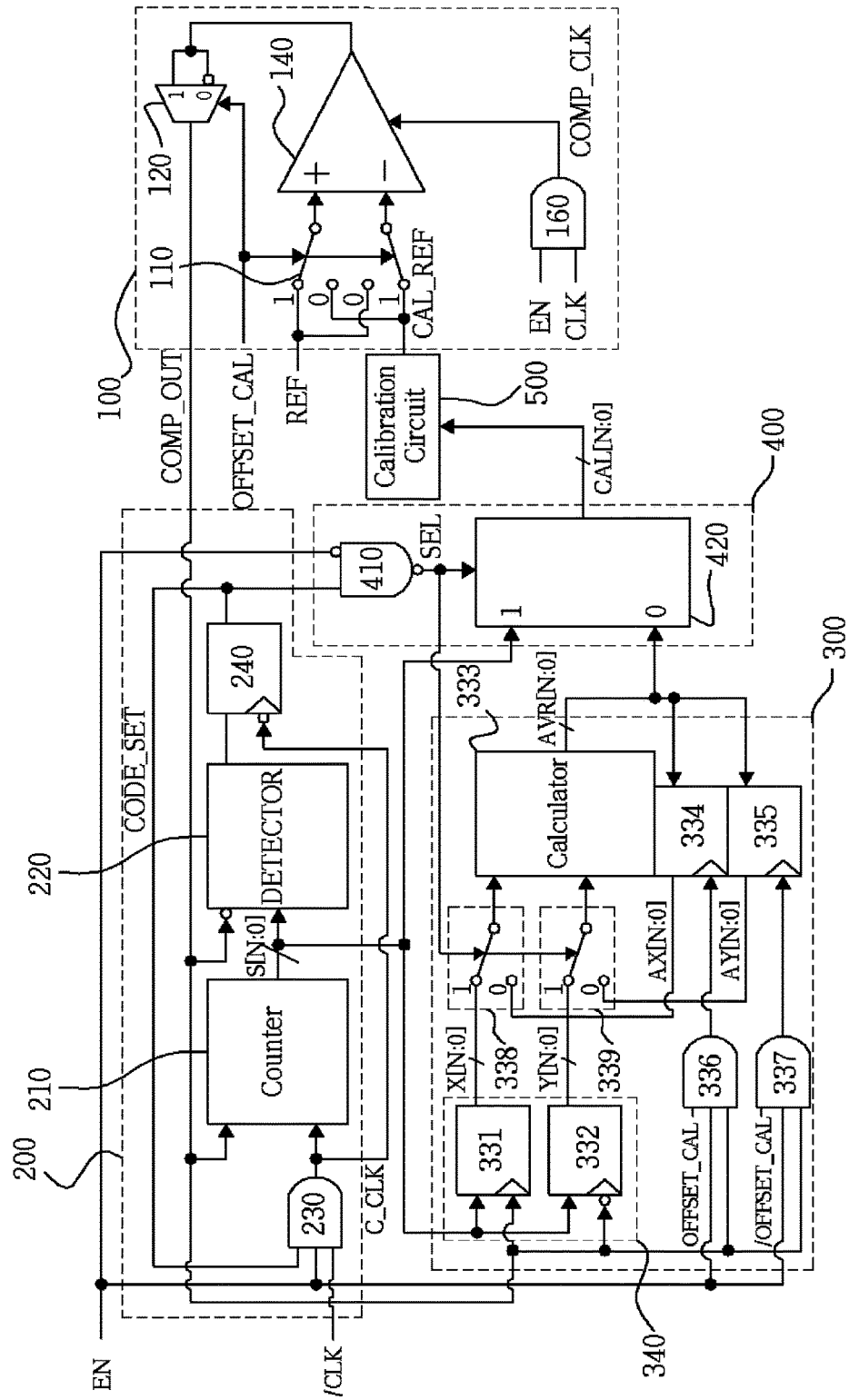
FIG. 1 is a circuit diagram illustrating a digital correction circuit according to an embodiment.

Hereafter, various embodiments of the present disclosure will be described in detail with reference to the accompanying drawings. The terms used in the present specification and claims are not limited to typical dictionary definitions, but must be interpreted into meanings and concepts which coincide with the technical idea of the present invention.

Various embodiments described in the present specification and configurations illustrated in the drawings are preferred embodiments of the present invention, and do not represent the entire technical idea of the present invention. Thus, various equivalents and modifications capable of replacing the embodiments and configurations may be provided at a point of time that the present application is filed.

The various embodiments disclose a technique for reducing errors in a digital correction circuit, which provides a control code for calibration, the errors being caused by comparison performance and a comparison offset of a comparator in the digital correction circuit.

During calibration, a digital correction circuit according to an embodiment generates two digital codes respectively decided at rising and falling edges of a first comparison signal, generates a center code having a median value of the two digital codes, and stores the center code as a first calculation code in a first mode. A comparator may output the first comparison signal by comparing a reference voltage and a control voltage in a non-inverting state. In addition, the digital correction circuit generates two digital codes respectively decided at rising and falling edges of a second comparison signal, generates a center code having a median value of the two digital codes, and stores the center code as a second calculation code in a second mode following the first mode. The comparator may output the second comparison signal by comparing the reference voltage and the control voltage in an inverting state. After the calibration is ended, the digital correction circuit calculates a new calculation code using the first and second calculation codes, and reflects the new calculation code into a control code provided to a calibration circuit.

The digital correction circuit can remove a correction error depending on the comparison ability of the comparator and correct a comparison offset, using the calculation code.

FIG. 1 illustrates a digital correction circuit according to an embodiment.

Various embodiments are based on the definition that calibration is performed in a calibration enable state and ended when the calibration enable state is changed to a calibration disable state. The calibration enable state and the calibration disable state may be decided according to an enable signal EN.

Referring to FIG. 1, the digital correction circuit includes a comparison circuit 100, a count code generation circuit 200, a calculation code generation circuit 300, a code selection circuit 400, and a calibration circuit 500.

The comparison circuit 100 compares a reference voltage REF and a control voltage CAL_REF output from the calibration circuit 500 in the calibration enable state. More specifically, the comparison circuit 100 compares the reference voltage REF and the control voltage CAL_REF in a non-inverted state in a first mode, compares the reference voltage REF and the control voltage CAL_REF in an inverted state in a second mode, and generates a comparison signal COMP_OUT based on the comparison result.

The count code generation circuit 200 provides a count code S[N:0] obtained by performing a counting operation on the comparison signal COMP_OUT in the calibration enable state, generates a detection signal CODE_SET indicating whether or not the count code S[N:0] deviates from a preset range, and stops the counting operation in response to the detection signal CODE_DET when the count code S[N:0] deviates from the preset range. The count code generation circuit 200 maintains a value of the finally counted code when the counting operation is stopped.

The calculation code generation circuit 300 performs a calculation process according to the first mode and the second mode. The calculation process includes generating a first code X[N:0] by sampling a value of the count code S[N:0], which satisfies a first preset condition; generating a second code Y[N:0] by sampling a value of the count code S[N:0], which satisfies a second preset condition; and generating a calculation code AVR[N:0] based on the first code X[N:0] and the second code Y[N:0]. Furthermore, in the calibration disable state, the calculation code generation circuit 300 performs a recalculation process using a first calculation code AX[N:0] and a second calculation code AY[N:0], which are stored in response to the first and second modes in the calibration enable state, thereby generating a recalculation code AVR[N:0].

The code selection circuit 400 provides the count code S[N:0] as a control code CAL[N:0] in the calibration enable state, and provides the recalculation code AVR[N:0] obtained by the recalculation process as the control code CAL[N:0] in the calibration disable state.

The calibration circuit 500 receives the control code CAL[N:0] from the code selection circuit 400, and outputs the control voltage CAL_REF corresponding to a digital value of the control code CAL[N:0]. The control voltage CAL_REF has an analog value corresponding to the digital value of the control code CAL[N:0]. The control voltage CAL_REF of the calibration circuit 500 traces the reference voltage REF according to a change of the control code CAL[N:0].

In the present embodiment, the enable signal EN, a clock signal CLK, an inverted clock signal /CLK, and an offset control signal OFFSET_CAL are received from an external device. The enable signal EN is enabled in synchronization with a reset signal RST (not illustrated), and controls operations of the comparison circuit 100, the count code generation circuit 200, the calculation code generation circuit 300, and the code selection circuit 400. An inverted reset signal of the reset signal RST may be represented by RSTB. The clock signal CLK and the inverted clock signal/CLK have opposite phases with respect to each other.

The enable signal EN is provided from outside the digital correction circuit, and is enabled to set the calibration enable state or is disabled to set the calibration disable state. The calibration enable state indicates that the calibration is being performed, and the calibration disable state indicates that the calibration has ended.

The offset control signal OFFSET_CAL is used to distinguish between the first mode for driving the comparator 140 in the non-inverted state and the second mode for driving the comparator 140 in the inverted state, while the enable signal EN is enabled for the calibration. For example, the offset control signal OFFSET_CAL may retain a high level in the first mode, and retain a low level in the second mode.

First, the configuration of the comparison circuit 100 will be described in detail as follows.

The comparison circuit 100 includes a switching circuit 110, an inverting circuit 120, a comparator 140, and an AND gate 160.

Among the components, the comparator 140 outputs a comparison result by comparing a first voltage at a positive input terminal (+) and a second voltage at a negative input terminal (−) in the calibration enable state. The comparator 140 may output the comparison result, which may have a high level of "1" or a low level of "0."

The comparator 140 outputs the comparison result having the high level of "1" when the first voltage of the positive input terminal (+) is equal to or higher than the second voltage of the negative input terminal (−), and outputs the comparison result having the low level of "0" when the first voltage of the positive input terminal (+) is lower than the second voltage of the negative input terminal (−).

The comparator 140 is driven by a comparison clock signal COMP_CLK, which toggles in synchronization with the clock signal CLK while the enable signal EN is enabled, and the comparison clock signal COMP_CLK may be output from the AND gate 160. The AND gate 160 performs an AND operation on the enable signal EN and the clock signal CLK. The comparison clock signal COMP_CLK may be used as a driving voltage of the comparator 140.

The switching circuit 110 is configured to change the input connection of the reference voltage REF and the control voltage CAL_REF to the positive input terminal (+) and the negative input terminal (−) of the comparator 140 according to the first and second modes. In the first mode, the reference voltage REF is input to the positive input terminal (+) and the control voltage CAL_REF is input to the negative input terminal (−). In the second mode, the control voltage CAL_REF is input to the positive input terminal (+) and the reference voltage REF is input to the negative input terminal (−).

That is, the switching circuit 110 is controlled to maintain the non-inverted state in the first mode and the inverted state in the second mode. In the non-inverted state, the switching circuit 110 provides the reference voltage REF to the positive input terminal (+) of the comparator 140 and provides the control voltage CAL_REF to the negative input terminal (−) of the comparator 140. In the inverted state, the switching circuit 110 provides the reference voltage REF to the negative input terminal (−) of the comparator 140 and provides the control voltage CAL_REF to the positive input terminal (+) of the comparator 140.

The switching circuit 110 may be controlled to have a first switching state corresponding to the first mode or a second switching state corresponding to the second mode, according to the offset control signal OFFSET_CAL. For example, when the offset control signal OFFSET_CAL is provided with a high level of "1," the switching circuit 110 is switched to implement the first mode. In contrast, when the offset control signal OFFSET_CAL is provided with a low level of "0," the switching circuit 110 is switched to implement the second mode.

When the offset control signal OFFSET_CAL having the high level of "1" is provided, the inverting circuit 120 transmits the comparison result output from the comparator 140 as a comparison signal COMP_OUT without inverting the comparison result. On the other hand, when the offset control signal OFFSET_CAL having the low level of "0" is provided, the inverting circuit 120 inverts the comparison result and transmits the inverted comparison result as the comparison signal COMP_OUT. The comparison signal COMP_OUT outputted via the inverting circuit 120 is provided to the count code generation circuit 200 and the calculation code generation circuit 300.

According to the above-described configuration, the comparison circuit 100 compares the reference voltage REF and the control voltage CAL_REF in the non-inverted state using the comparator 140 and outputs the comparison signal COMP_OUT via the inverting circuit 120, in the first mode decided by the offset control signal OFFSET_CAL having the high level of "1." Furthermore, the comparison circuit 100 compares the reference voltage REF and the control voltage CAL_REF in the inverted state using the comparator 140 and outputs the comparison signal COMP_OUT via the inverting circuit 120, in the second mode decided by the offset control signal OFFSET_CAL having the low level of "0."

The count code generation circuit 200 includes a counter 210, a detector 220, a detection output circuit 240, and an AND gate 230.

The AND gate 230 generates a count clock signal C_CLK by performing an AND operation on the inverted clock signal/CLK, the enable signal EN, and the detection signal CODE_SET; and provides the count clock signal C_CLK to the counter 210 and the detection output circuit 240.

According to the above-described configuration, the AND gate 230 outputs the count clock signal C_CLK, which toggles in synchronization with the inverted clock signal/CLK while the enable signal EN and the detection signal CODE_SET are enabled. When at least one of the enable signal EN and the detection signal CODE_SET is disabled, the count clock signal C_CLK is set to a low level without toggling.

The counter 210 performs an up-count or down-count operation on the comparison signal COMP_OUT received from the comparison circuit 100 in response to the count clock signal C_CLK in the calibration enable state where the enable signal EN is enabled, and outputs the count code S[N:0] having (N+1) bits.

More specifically, when the comparison signal COMP_OUT is changed to a high level, the counter 210 performs a binary up-count operation, and outputs the count code S[N:0], which has an increasing digital value. On the other hand, when the comparison signal COMP_OUT is changed to a low level, the counter 210 performs a binary down-count operation, and outputs the count code S[N:0], which has a decreasing digital value.

The count code S[N:0] of the counter 210 is provided to the detector 220.

The detector 220 may detect whether the count code S[N:0] deviates from the preset range, and provide the corresponding detection signal CODE_SET based on the detection result.

More specifically, the detector 220 receives the comparison signal COMP_OUT and the count code S[N:0], determines whether the count code S[N:0] overflows or underflows the preset range based on the comparison signal COMP_OUT, and outputs the detection signal CODE_SET. The detection signal CODE_SET is outputted with a high level of "1" when the digital value of the count code S[N:0] falls in the preset range, and outputted with a low level of "0" when the digital value of the count code S[N:0] overflows or underflows the preset range.

The high-level detection signal CODE_SET acts on the AND gate 230, and thus guarantees the toggling of the count clock signal C_CLK. In this case, the counter 210 can normally perform the counting operation. However, when the low-level detection signal CODE_SET disables the count clock signal C_CLK, the counter 210 stops the counting operation, and retains the digital value of the count code S[N:0], which has been obtained just before the counting operation is stopped, as the maximum digital value or minimum digital value in the preset range.

As described above, the detector 220 detects an overflow or underflow of the count code S[N:0], and controls the counter 210 to perform the counting operation in the preset range.

The detection signal CODE_SET of the detector 220 may be outputted by the detection output circuit 240 in synchronization with the count clock signal C_CLK. The detection output circuit 240 may include a D-flip flop, which transmits the detection signal CODE_SET in synchronization with the count clock signal C_CLK.

As described above, the count code generation circuit 200 generates and provides the count code S[N:0] in the preset range in the calibration enable state, in which the enable signal EN is enabled.

The count code S[N:0] is provided to a multiplexer 420 of the code selection circuit 400.

The code selection circuit 400 includes the multiplexer 420 and a NAND gate 410.

The NAND gate 410 is configured to receive the detection signal CODE_SET through a non-inverting input terminal, receive the enable signal EN through an inverting input terminal, and output a select signal SEL.

The multiplexer 420 is configured to output one of the count code S[N:0] of the count code generation circuit 200 and the calculation code AVR[N:0] of the calculation code generation circuit 300 as the control code CAL[N:0], in response to the select signal SEL of the NAND gate 410.

More specifically, the multiplexer 420 may output the count code S[N:0] of the count code generation circuit 200 as the control code CAL[N:0] when the select signal SEL is at a high level of "1," and output the calculation code AVR[N:0] of the calculation code generation circuit 300 as the control code CAL[N:0] when the select signal SEL is at a low level of "0."

The select signal SEL becomes "1" when the detection signal CODE_SET is "0." When the detection signal CODE_SET is "1," the level of the selection signal SEL is determined according to the enable signal EN. For example, in a case of the detection signal CODE_SET being "1," when the enable signal EN is enabled to a high level of "1," the select signal SEL becomes "1," and when the enable signal EN is disabled to a low level of "0," the select signal SEL becomes "0." Therefore, in the calibration enable state in which the enable signal EN is enabled to the high level of "1," the select signal SEL becomes "1," and thus the multiplexer 420 outputs the count code S[N:0] of the count code generation circuit 200 as the control code CAL[N:0]. On the other hand, in the calibration disable state in which the enable signal EN is disabled to the low level of "0," the select signal SEL becomes "0," and thus the multiplexer 42 outputs the calculation code AVR[N:0] of the count code generation circuit 200 as the control code CAL[N:0].

The configuration of the calculation code generation circuit 300 to generate the calculation code AVR[N:0] will be described hereinafter.

The calculation code generation circuit 300 includes a sampler 340, a switching circuit, a calculator 333, a calculation storage circuit, and a calculation controller. The sampler 340 may include first and second sampling circuits 331 and 332. The switching circuit may include first and second switches 338 and 339. The calculation storage circuit may include first and second storage circuits 334 and 335. The calculation controller may include first and second AND gates 336 and 337.

The sampler 340 outputs the first code X[N:0] corresponding to a value of the count code S[N:0], which satisfies the first preset condition, and outputs the second code Y[N:0] corresponding to a value of the count code S[N:0], which satisfies the second preset condition.

For this operation, the sampler 340 includes the first sampling circuit 331 and the second sampling circuit 332. The first sampling circuit 331 is configured to output the first code X[N:0] corresponding to the value of the count code S[N:0], which satisfies the first present condition. The second sampling circuit 332 is configured to outputs the second code Y[N:0] corresponding to the value of the count code S[N:0], which satisfies the second present condition.

The first sampling circuit 331 samples a value of the count code S[N:0] satisfying the first preset condition, which is detected at a rising edge of the comparison signal COMP_OUT, and the second sampling circuit 332 samples a value of the count code S[N:0] satisfying the second preset condition, which is detected at a falling edge of the comparison signal COMP_OUT. That is, the first preset condition may include detecting the rising edge of the comparison signal COMP_OUT, and the second preset condition may include detecting the falling edge of the comparison signal COMP_OUT. Therefore, the first sampling circuit 331 detects a value of the count code S[N:0] at the rising edge of the comparison signal COMP_OUT and generates the first code X[N:0] with the detected value, and the second sampling circuit 332 detects a value of the count code S[N:0] at the falling edge of the comparison signal COMP_OUT and generates the second code Y[N:0] with the detected value.

For this sampling operation, each of the first and second sampling circuits 331 and 332 may include a plurality of D-flip flops for processing (N+1) bits of the count code S[N:0]. In this case, the first sampling circuit 331 may sample a value of the count code S[N:0] in synchronization with a first time point at which the comparison signal COMP_OUT is changed to a positive state, and the second sampling circuit 332 may sample a value of the count code S[N:0] in synchronization with a second time point at which the comparison signal COMP_OUT is changed to a negative state.

In the switching circuit, the first switch 338 is configured to select one of the first code X[N:0] of the first sampling circuit 331 and the first calculation code AX[N:0] of the first storage circuit 334 in response to the select signal SEL, and to provide the selected code as a first input of the calculator 333. The second switch 339 is configured to select one of the second code Y[N:0] of the second sampling circuit 332 and the second calculation code AY[N:0] of the second storage circuit 335 in response to the select signal SEL, and to provide the selected code as a second input of the calculator 333.

The calculator 333 is configured to generate the calculation code AVR[N:0] using the first and second inputs.

More specifically, the calculator 333 may be implemented with a center code generator, which is configured to decide a center code by averaging the first and second inputs and to output the center code as the calculation code AVR[N:0].

For this operation, the calculator 333 may add data of the first input and data of the second input using a full adder, truncate the least significant bit (LSB) included in the added data, and carry the resultant value, thereby acquiring high-order (N+1) bits. That is, the calculator 333 may calculate an average value of the first and second inputs using a bit shift effect, thereby obtaining the center code of the first and second inputs. The calculator 333 may output the center code as the calculation code AVR[N:0].

In the calculation storage circuit, the first storage circuit 334 stores the calculation code AVR[N:0] corresponding to the first mode as the first calculation code AX[N:0], and the second storage circuit 335 stores the calculation code AVR[N:0] corresponding to the second mode as the second calculation code AY[N:0], in the calibration enable state.

The storage operations of the first and second storage circuits 334 and 335 are controlled by outputs of the first and second AND gates 336 and 337, respectively, included in the calculation controller.

In the calibration enable state, the first AND gate 336 included in the calculation controller controls the first storage circuit 334 to store the calculation code AVR[N:0] corresponding to the first mode as the first calculation code AX[N:0]. In the calibration enable state, the second AND gate 337 included in the calculation controller controls the second storage circuit 335 to store the calculation code AVR[N:0] corresponding to the second mode as the second calculation code AY[N:0].

The first AND gate 336 receives the enable signal EN, the offset control signal OFFSET_CAL, and the comparison signal COMP_OUT. In the first mode, the enable signal EN and the offset control signal OFFSET_CAL maintain the enable state. Thus, in the first mode, the first AND gate 336 controls the first storage circuit 334 to store the calculation code AVR[N:0] as the first calculation code AX[N:0] at a point of time when the control voltage CAL_REF becomes lower than the reference voltage REF, that is, at a point of time when the comparison signal COMP_OUT transitions to the high level.

The second AND gate 337 receives the enable signal EN, the inverted offset control signal /OFFSET_CAL, and the comparison signal COMP_OUT. In the second mode, the enable signal EN and the inverted offset control signal /OFFSET_CAL maintain the enable state. Thus, in the second mode, the second AND gate 337 controls the second storage circuit 335 to store the calculation code AVR[N:0] as the second calculation code AY[N:0] at a point of time when the control voltage CAL_REF becomes lower than the reference voltage REF, that is, at a point of time when the comparison signal COMP_OUT transitions to a high level.

According to the above-described configuration, the calculation code generation circuit 300 performs a first calculation process in the first mode where the offset control signal OFFSET_CAL is enabled to a high level during the calibration enable state. The first calculation process includes generating the first code X[N:0] and the second code Y[N:0] with a time difference therebetween in synchronization with a point of time when the comparison signal COMP_OUT is changed, calculating the center code of the first and second codes X[N:0] and Y[N:0] using the calculator 333 at a point of time when the first and second codes X[N:0] and Y[N:0] are generated, and storing the center code as the first calculation code AX[N:0] in the first storage circuit 334.

Then, the calculation code generation circuit 300 performs a second calculation process in the second mode where the offset control signal OFFSET_CAL is changed to a low level during the calibration enable state. The second calculation process includes generating the first code X[N:0] and the second code Y[N:0] with a time difference therebetween in synchronization with a point of time when the comparison signal COMP_OUT is changed, calculating the center code of the first and second codes X[N:0] and Y[N:0] using the calculator 333 at a point of time when the first and second codes X[N:0] and Y[N:0] are generated, and storing the center code as the second calculation code AY[N:0] in the second storage circuit 335.

Then, when the calibration enable state is changed to the calibration disable state, the select signal SEL is changed to a low level of "0," the first switch 338 provides the first calculation code AX[N:0] of the first storage circuit 334 as the first input to the calculator 333, and the second switch 339 provides the second calculation code AY[N:0] of the second storage circuit 335 as the second input to the calculator 333.

Thus, the calculator 333 calculates a center code of the first and second calculation codes AX[N:0] and AY[N:0], and provides the center code as the calculation code AVR[N:0] to the multiplexer 420. At this time, the calculation code AVR[N:0] may correspond to a value obtained by correcting an error caused by the comparison offset and comparison performance of the comparator 140.

The multiplexer 420 provides the calculation code AVR[N:0] as the control code CAL[N:0] in response to the select signal SEL having the low level of "0."

As a result, the digital correction circuit according to the present embodiment may generate the optimized control code CAL[N:0] regardless of the comparison offset and comparison performance of the comparator 140, and calibrate the control voltage CAL_REF using the optimized control code CAL[N:0].

Figure 2:
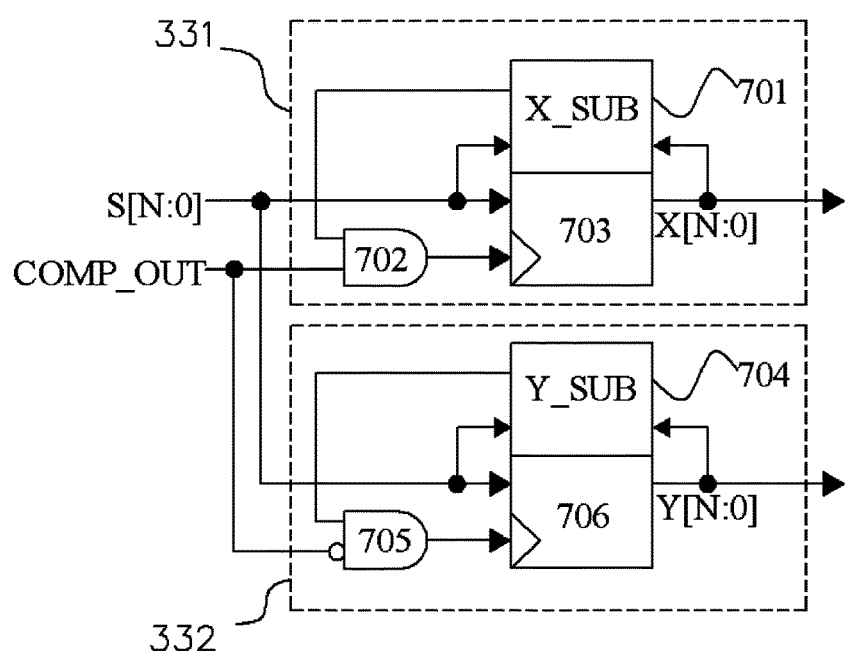
FIG. 2 is a diagram illustrating another embodiment of a sampler of FIG. 1.

FIG. 2 illustrates another embodiment of the sampler 340 of FIG. 1. Referring to FIG. 2, the sampler 340 may include the first sampling circuit 331 and the second sampling circuit 332 operating as a peak detector, respectively. The first sampling circuit 331 may sample a minimum value, which satisfies a first condition for detecting a first peak of the comparison signal COMP_OUT. And, the second sapling circuit 332 may sample a maximum value, which satisfies a second condition for detecting a second peak of the comparison signal COMP_OUT.

The first sampling circuit 331 may compare an input count code S[N:0] and a first stored count code X[N:0]. When the input count code S[N:0] is smaller than the first stored count code X[N:0], the first sampling circuit may update the first stored count code X[N:0] with the input count code S[N:0], and determine the input count code S[N:0] as the minimum value, the input count code S[N:0] corresponding to the first peak at which a value obtained by subtracting the first stored count code X[N:0] from the input count code S[N:0] has a negative value.

For this operation, the first sampling circuit includes a comparator 701, an AND gate 702, and a D-flip flop 703.

The D-flip flop 703 stores the input count code S[N:0] as the first stored count code X[N:0] in response to an output signal of the AND gate 702.

The comparator 701 compares the input count code S[N:0] and the first stored count code X[N:0], and outputs a value to control the updating of the first stored count code X[N:0] with the input count code S[N:0] when the input count code S[N:0] is smaller than the first stored count code X[N:0].

The AND gate 702 performs an AND operation on the output of the comparator 701 and the comparison signal COMP_OUT, such that a value of the input count code S[N:0] is sampled as the minimum value. In this case, the input count code S[N:0] corresponds to the first peak at which the value obtained by subtracting the first stored count code X[N:0] from the input count code S[N:0] has a negative value.

The second sampling circuit 332 compares the input count code S[N:0] and a second stored count code Y[N:0]. When the input count code S[N:0] is larger than the second stored count code Y[N:0], the second sampling circuit updates the second stored count code Y[N:0] with the input count code S[N:0], and samples a value of the input count code S[N:0] as the maximum value. In this case, the input count code S[N:0] corresponds to the second peak at which a value obtained by subtracting the second stored count code Y[N:0] from the input count code S[N:0] has a positive value.

For this operation, the second sampling circuit 332 includes a comparator 704, an AND gate 705, and a D-flip flop 706.

The D-flip flop 706 stores the input count code S[N:0] as the second stored count code Y[N:0] in response to an output signal of the AND gate 705.

The comparator 704 compares the input count code S[N:0] and the second stored count code Y[N:0], and outputs a value to control the updating of the second stored count code Y[N:0] with the input count code S[N:0] when the input count code S[N:0] is larger than the second stored count code Y[N:0].

The AND gate 705 performs an AND operation on the output of the comparator 704 and the inverted value of the comparison signal COMP_OUT, such that the input count code S[N:0] is sampled as the maximum value. In this case, the input count code S[N:0] corresponds to the second peak at which the value obtained by subtracting the second stored count code Y[N:0] from the input count code S[N:0] has a positive value.

Figure 3:
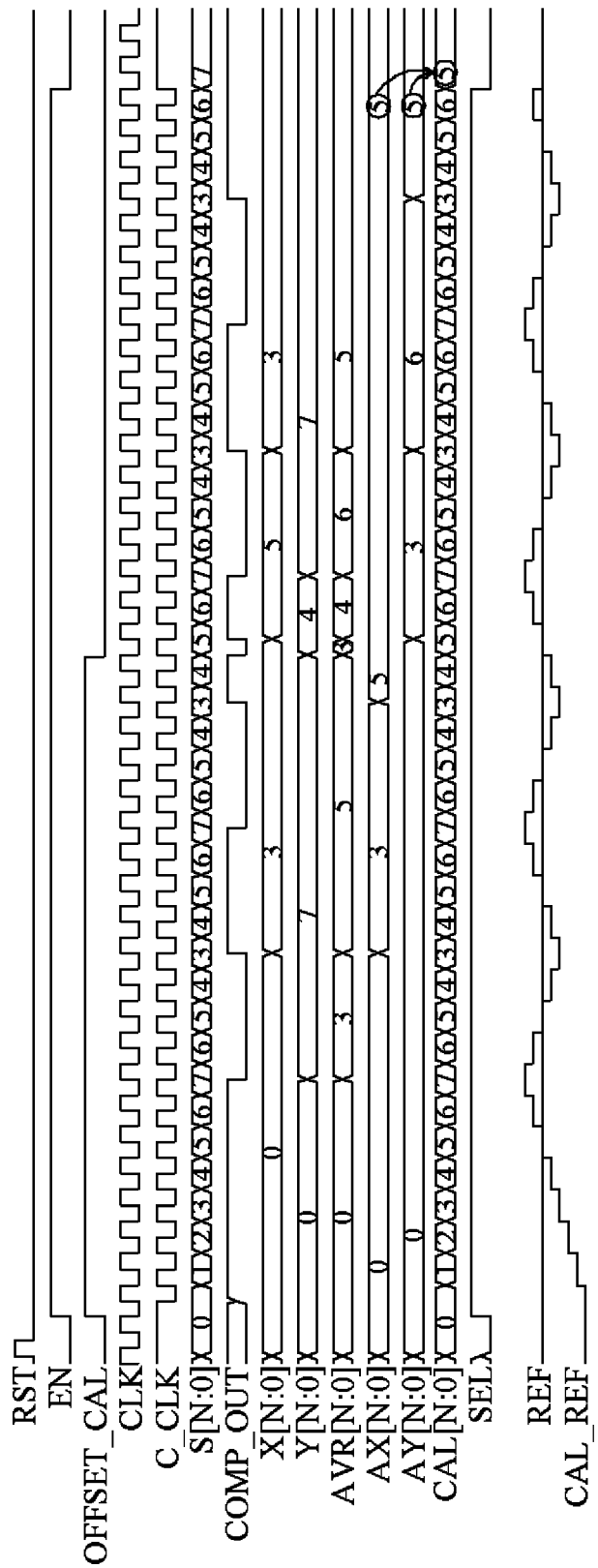
FIG. 3 is a timing diagram showing an operation of the digital correction circuit of FIG. 1 when no comparison offset is present.

FIG. 3 is a timing diagram showing an operation of the digital correction circuit of FIG. 1 when no comparison offset is present.

Referring to FIG. 3, the enable signal EN for performing calibration is enabled to a high level after the reset signal RST is generated.

Due to the comparison performance limit of the comparator 140, the count code S[N:0] outputted from the counter 210 of the count code generation circuit 200 has a pattern such that the count code S[N:0] has values within a range limited by the detector 220.

More specifically, the count code S[N:0] has a pattern, which is repeated, the repeated pattern including, e.g., 3, 4, 5, 6, 7, 6, 5, 4, and 3 in the range of 3 to 7.

The digital correction circuit according to the present embodiment performs a process of sampling the count code S[N:0] through the calculation code generation circuit 300 and storing the calculation code AVR[N:0], while the calibration circuit 500 performs calibration using the count code S[N:0] having the repeated pattern. At this time, the digital correction circuit performs the sampling and storing process once in each of a high state and a low state of the offset control signal OFFSET_CAL.

That is, the calculation code generation circuit 300 performs calculation of the calculation code AVR[N:0] two times when the offset control signal OFFSET_CAL is in the high state and the low state, while the enable signal EN retains a high level.

Specifically, the calculation code generation circuit 300 provides the first and second codes X[N:0] and Y[N:0], which are determined according to values of the count code S[N:0] detected at rising and falling edges of the comparison signal COMP_OUT, respectively, when the offset control signal OFFSET_CAL retains a high level.

In FIG. 3, a maximum value of 7 of the count code S[N:0] is first sampled as the second code Y[N:0] at the falling edge of the comparison signal COMP_OUT, and a minimum value of 3 of the count code S[N:0] is then sampled as the first code X[N:0] at the rising edge of the comparison signal COMP_OUT.

In the calibration enable state where the enable signal EN has the high level, the first and second switches 338 and 339 connect the calculator 333 to the first and second sampling circuits 331 and 332, respectively. Therefore, the calculator 333 generates a center code corresponding to "5," which is an average value of the first and second codes X[N:0] and Y[N:0] that correspond to "3" and "7," and provides the center code "5" as the calculation code AVR[N:0] to the first storage circuit 334. The first storage circuit 334 stores "5" as the first calculation code AX[N:0].

Then, the calculation code generation circuit 300 performs the above-described calculation process again when the offset control signal OFFSET_CAL retains a low level. Since the result of the second calculation process performed when the offset control signal OFFSET_CAL retains the low level is the same as the result of the first calculation process performed when the offset control signal OFFSET_CAL retains the high level, the descriptions of the second calculation process are omitted herein for the simplicity of explanation.

After the second calculation process is complete, the calculator 333 provides the calculation code AVR[N:0] to the second storage circuit 335, and the second storage circuit 335 stores "5" as the second calculation code AY[N:0].

Then, when the enable signal EN is changed to a low level, and thus the calibration enable state is switched to the calibration disable state, the first and second switches 338 and 339 connect the calculator 333 to the first and second storage circuits 334 and 335, respectively. At this time, the select signal SEL is changed from "1" to "0." Therefore, the multiplexer 22 selects the calculation code AVR[N:0] of the calculator 333 as the control code CAL[N:0], and provides the selected code to the calibration circuit 500.

When the select signal SEL is changed from "1" to "0," the calculator 333 receives the first and second calculation codes AX[N:0] and AY[N:0] as inputs according to the switching states of the first and second switches 338 and 339, generates a center code by calculating an average value of the first and second calculation codes AX[N:0] and AY[N:0], and provides the generated center code as the calculation code AVR[N:0] provided to the multiplexer 420.

The digital correction circuit according to the present embodiment can repeatedly generate the center code, that is, the calculation code AVR[N:0], as illustrated in FIG. 3, and thus can correct an error, which may occur due to a pattern that is repeated by the comparison performance of the comparator 140.

In order to repeatedly generate the center code, the digital correction circuit may repeat a calibration process for a sufficient time.

Figure 4:
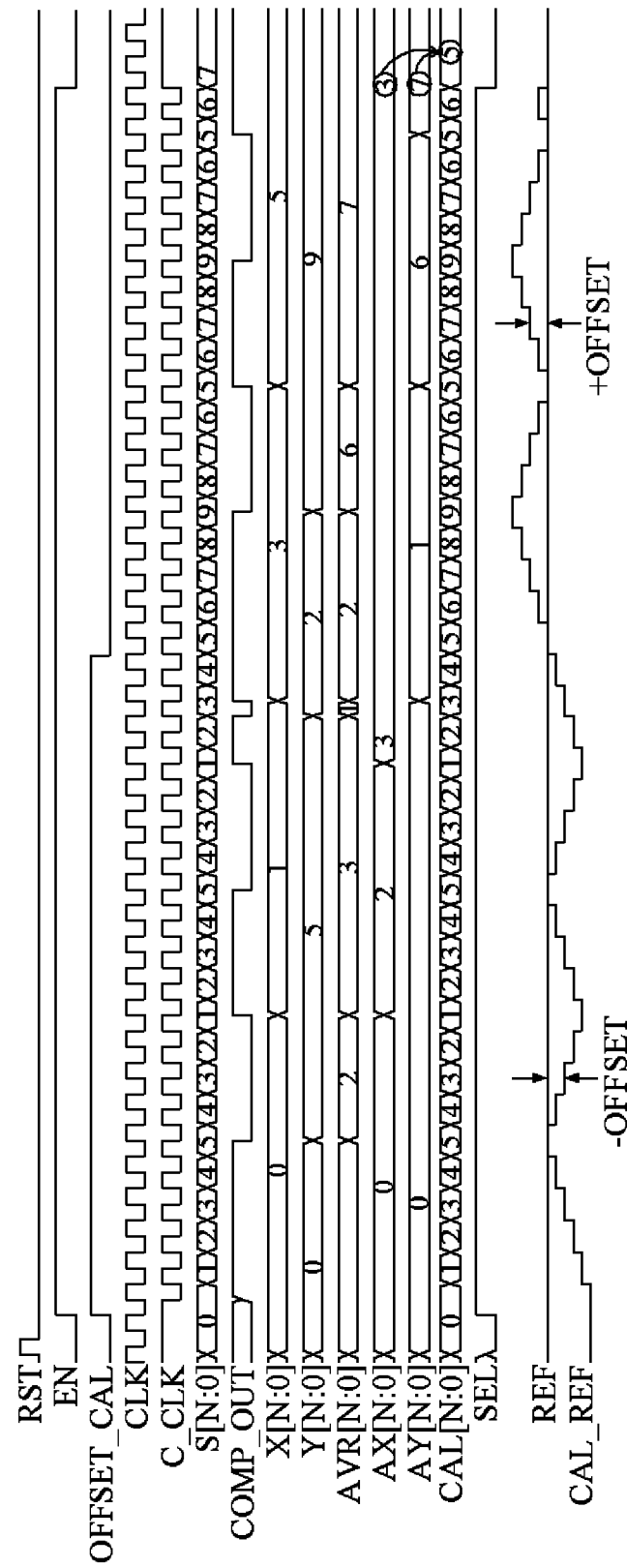
FIG. 4 is a timing diagram showing an operation of the digital correction circuit of FIG. 1 when a comparison offset is present.

FIG. 4 is a timing diagram showing an operation of the digital correction circuit of FIG. 1 when a comparison offset is present.

When the offset control signal OFFSET_CAL is at a high level, the count code S[N:0] has a pattern such that the count code S[N:0] has values within a range of 1 to 5, a repeated pattern including, e.g., 5, 4, 3, 2, 1, 2, 3, and 4 due to the influence of the comparison offset. Furthermore, when the offset control signal OFFSET_CAL is at a low level, the count code S[N:0] has a pattern such that the count code S[N:0] has values within a range of 5 to 9 and a repeated pattern, e.g., 9, 8, 7, 6, 5, 6, 7, and 8, due to the influence of the comparison offset.

When the offset control signal OFFSET_CAL is at the high level, the calculator 333 generates a center code corresponding to "3," which is an average value of the first and second codes X[N:0] and Y[N:0], and provides the center code as the calculation code AVR[N:0] to the first storage circuit 334. On the other hand, when the offset control signal OFFSET_CAL is at the low level, the calculator 333 generates a center code corresponding to "7," which is an average value of the first and second codes X[N:0] and Y[N:0], and provides the center code as the calculation code AVR[N:0] to the second storage circuit 335.

Then, when the enable signal EN is changed to a low level and thus the calibration enable state is switched to the calibration disable state, the calculator 333 recalculates and generates a center code corresponding to "5," which is an average value of "3" and "7," which are the calculation codes AVR[N:0] stored in the first and second storage circuits 334 and 335, respectively, and provides the recalculated center code as the calculation code AVR[N:0] to the multiplexer 420. Then, the multiplexer 420 reflects "5" into the control code CAL[N:0].

Through the above-described process, the calculation code generation circuit 300 can correct the comparison performance and comparison offset of the comparator 140 for digital correction, and perform optimized control of the calibration.

Figure 5:
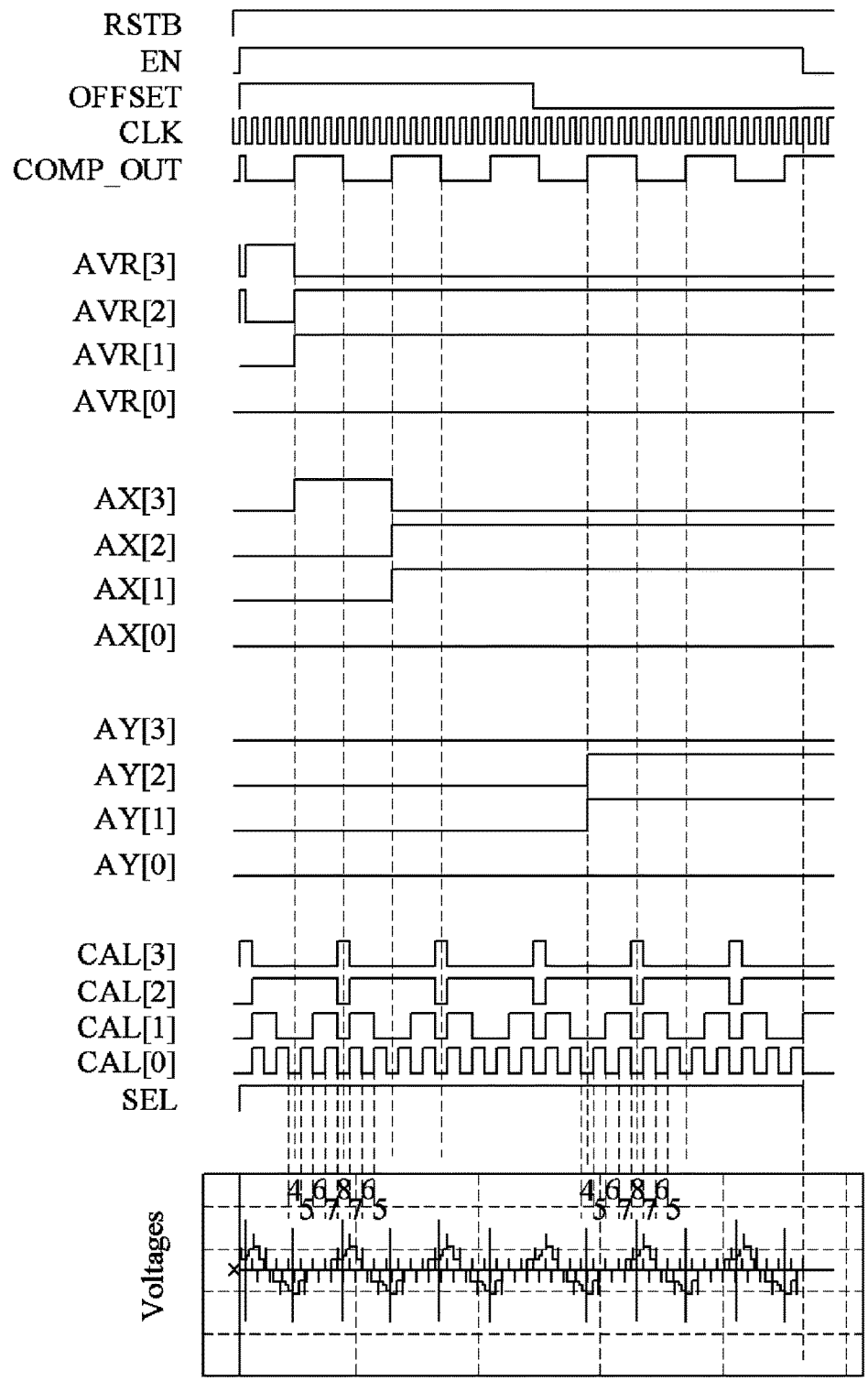
FIG. 5 illustrates a simulation result of the embodiment shown in FIG. 1 when no comparison offset is present.
Figure 6:
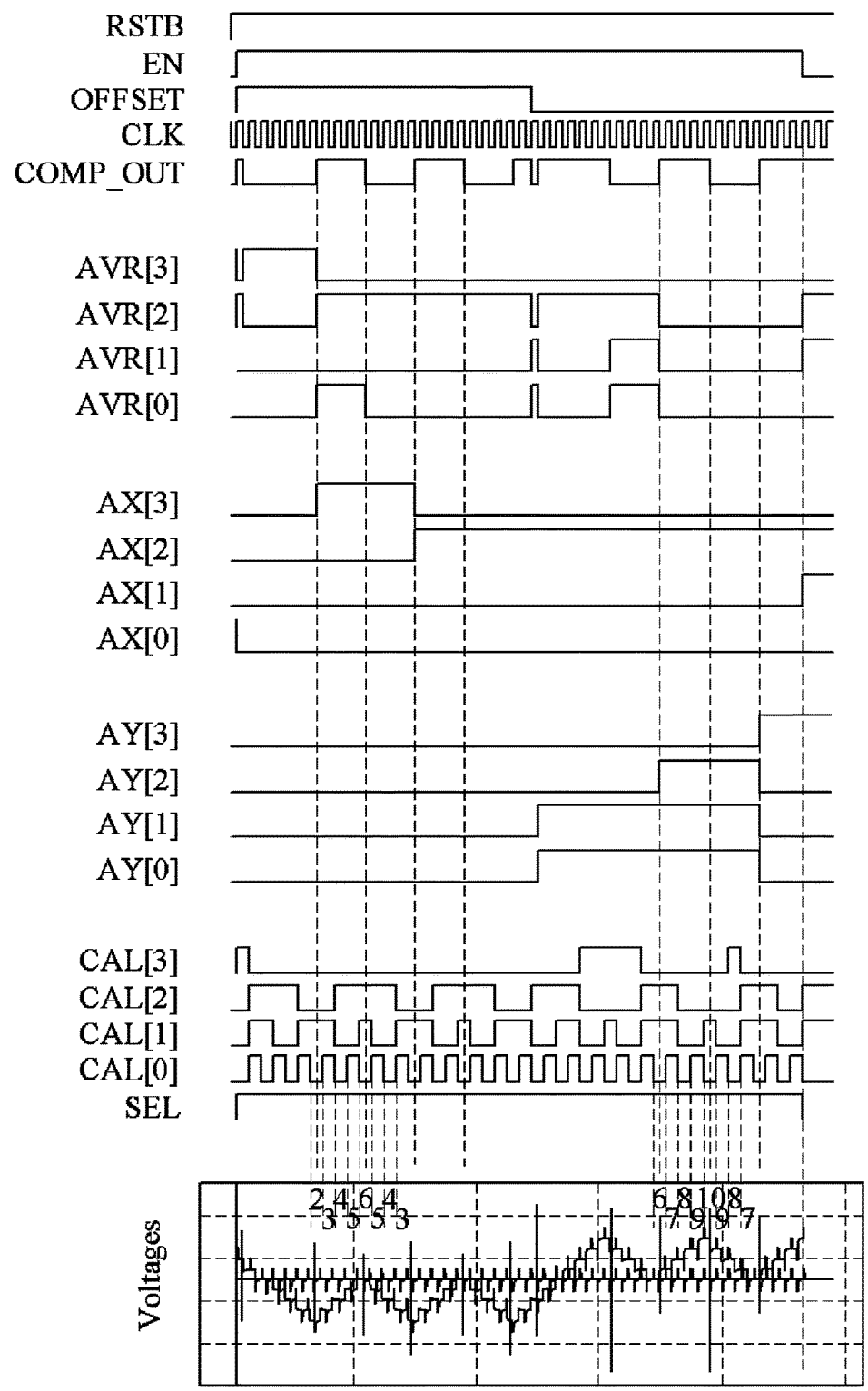
FIG. 6 illustrates a simulation result of the embodiment shown in FIG. 1 when a comparison offset is present.

FIGS. 5 and 6 illustrate simulation results of the embodiment shown in FIG. 1.

FIGS. 5 and 6 are based on the pre-supposition that the count code S[N:0], the first code X[N:0], the second code Y[N:0], the first calculation code AX[N:0], the second calculation code AY[N:0], the calculation code AVR[N:0], and the control code CAL[N:0] are each 4-bit data.

In the digital correction circuit used for the simulation of FIGS. 5 and 6, the comparator 140 has a comparison performance of about 0.5 mV, the control resolution is set to 0.28 mV, and N is set to 3 to perform a 4-bit count operation.

FIG. 5 illustrates a simulation result of the embodiment shown in FIG. 1 when no comparison offset is present.

Referring to FIG. 5, when the enable signal EN is changed to a high level, such that the calibration enable state is set, the control voltage CAL_REF traces the reference voltage REF. At this time, since the control resolution is smaller than the comparison performance of the comparator 140, the count code S[3:0] repeats five sequential digital values of 4, 5, 6, 7, and 8. When the calibration is performed up to the limit of the comparison performance, the count code S[3:0] is changed to a sequential pattern of 4, 5, 6, 7, 8, 7, 6, and 5. During this process, the calculation code AVR[3:0] is generated by the calculation code generation circuit 300.

When the enable signal EN is changed to a low level to end the calibration, the calculation code generation circuit 300 outputs the calculation code AVR[3:0] as the control code CAL[3:0]. The calculation code AVR[3:0] is generated while the enable signal EN retains the high level. At this time, the output control code CAL[3:0] may have a digital value corresponding to the reference voltage REF regardless of the control resolution and the comparison performance.

FIG. 6 illustrates a simulation result when an offset is added to the comparison performance limit of the comparator 140, unlike the simulation of FIG. 5.

Referring to FIG. 6, when the enable signal EN transitions to a high level and the offset control signal OFFSET_CAL transitions to a high level, such that the calibration enable state is set, the control voltage CAL_REF traces the reference voltage REF. At this time, the count code S[3:0] repeats five sequential digital values of 2, 3, 4, 5, and 6 due to the control resolution, which is smaller than the comparison performance of the comparator 140, and due to a first offset, which is generated by the code selection circuit 400. Then, when the offset control signal OFFSET_CAL transitions to a low level, the control code CAL[3:0] repeats different five sequential digital values of 6, 7, 8, 9, and 10 due to a second offset having an opposite direction to the first offset. During this process, the calculation code AVR[3:0] is generated by the calculation code generation circuit 300.

When the enable signal EN is changed to a low level to end the calibration, the calculation code generation circuit 300 outputs the recalculated calculation code AVR[3:0], and the calculation code AVR[3:0] is provided as the control code CAL[3:0] to the calibration circuit 500. At this time, the control code CAL[3:0] may have a digital value corresponding to the reference voltage REF regardless of the offset and the control resolution of the comparator 140.

As described above, the digital correction circuit according to the present embodiment can remove the influence of the comparison offset or comparison performance of the comparator 140, which limits the accuracy during a digital correction process for calibration, thereby providing an optimized calibration result.

Furthermore, the digital correction circuit according to the present embodiment can correct an error caused by the comparison offset or an error caused by a comparison performance of the comparator 140, thereby reducing a load in configuring a comparison circuit for performing digital correction at high resolution for calibration.

Although various embodiments have been described for illustrative purposes, it will be apparent to those skilled in the art that various changes and modifications may be made without departing from the spirit and scope of the invention as defined in the following claims.

What is claimed is:

1. A digital correction circuit comprising:
   a comparison circuit suitable for comparing a reference voltage and a control voltage of a calibration circuit in a calibration enable state, the reference voltage and the control voltage being compared in a non-inverted state in a first mode, the reference voltage and the control voltage being compared in an inverted state in a second mode, the comparison circuit being suitable for generating a comparison signal depending on whether the first or second mode is enabled;
   a count code generation circuit suitable for generating a count code by performing a counting operation on the comparison signal in the calibration enable state, for generating a detection signal indicating whether the count code deviates from a preset range, and for stopping the counting operation in response to the detection signal when the count code deviates from the preset range;
a calculation code generation circuit suitable for performing a calculation process according to the first and second modes, the calculation process including:
generating a first code by sampling a first value of the count code when the value of the count code satisfies a first preset condition;
generating a second code by sampling a second value of the count code when the value of the count code satisfies a second preset condition;
generating first and second calculation codes using the first and second codes in the first and second modes, respectively; and
generating, in a calibration disable state, a third calculation code using the first and second calculation codes generated in the first and second modes, respectively; and
a code selection circuit suitable for providing the count code as a control code in the calibration enable state, and for providing the third calculation code as the control code in the calibration disable state.

2. The digital correction circuit of claim 1, wherein the comparison circuit comprises:
a comparator suitable for outputting a comparison result in the calibration enable state;
a switching circuit suitable for switching a connection state between the reference voltage and the control voltage to a positive input terminal and a negative input terminal of the comparator, the reference voltage and the control voltage being provided to the positive and negative input terminals, respectively, in the first mode, and being provided to the negative and positive input terminals, respectively, in the second mode; and
an inverting circuit configured to transmit, in the first mode, the comparison result as the comparison signal without inverting the comparison result, and to invert and transmit, in the second mode, the inverted comparison result as the comparison signal.

3. The digital correction circuit of claim 1, wherein the calculation code generation circuit comprises:
a sampler suitable for generating the first code by sampling the first value of the count code that satisfies the first preset condition, and generating the second code by sampling the second value of the count code that satisfies the second preset condition;
a switching circuit suitable for transmitting the first and second codes as first and second inputs in the calibration enable state, and for transmitting the first and second calculation codes as the first and second inputs in the calibration disable state;
a calculator suitable for generating the first to third calculation codes using the first and second inputs;
a calculation storage circuit suitable for storing the first and second calculation codes in the calibration enable state; and
a calculation controller suitable for controlling the calculation storage circuit to store the first and second calculation codes in the calibration enable state.

4. The digital correction circuit of claim 3, wherein the sampler comprises:
a first sampling circuit suitable for generating the first code by sampling the first value of the count code that satisfies the first preset condition; and
a second sampling circuit suitable for generating the second code by sampling the second value of the count code that satisfies the second preset condition.

5. The digital correction circuit of claim 4, wherein the first sampling circuit samples the first value of the count code at a rising edge of the comparison signal, and
the second sampling circuit samples the second value of the count code at a falling edge of the comparison signal.

6. The digital correction circuit of claim 4, wherein the first sampling circuit comprises a first peak detector suitable for detecting a first peak of the count code by sampling a minimum value of the count code that satisfies the first preset condition, and
wherein the second sampling circuit comprises a second peak detector suitable for detecting a second peak of the count code by sampling a maximum value of the count code that satisfies the second preset condition.

7. The digital correction circuit of claim 3, wherein the calculator decides a center code by averaging the first and second inputs, and provides the center code as a corresponding one of the first to third calculation codes.

8. The digital correction circuit of claim 3, wherein the calculation storage circuit comprises a first storage circuit and a second storage circuit, the first storage circuit being suitable for storing the first calculation code, the second storage circuit being suitable for storing the second calculation code, and
wherein the calculation controller controls the first storage circuit to store the first calculation code that is generated at a time when the comparison signal changes in the first mode, and controls the second storage circuit to store the second calculation code that is generated at a time when the comparison signal changes in the second mode.

9. The digital correction circuit of claim 1, wherein the calibration enable state and the calibration disable state are set by an enable signal, which controls the counting operation.

10. A calculation code generation circuit comprising:
a sampler suitable for receiving a count code generated by a counting operation performed based on a comparison signal, which is obtained by comparing, by a comparator, a control voltage outputted from a calibration circuit to a reference voltage; for generating a first code by sampling a first value of the count code that satisfies a first preset condition; and for generating a second code by sampling a second value of the count code that satisfies a second preset condition;
a switching circuit suitable for transmitting the first and second codes as first and second inputs in a calibration enable state, and for transmitting first and second calculation codes as the first and second inputs in a calibration disable state;
a calculator suitable for generating the first and second calculation codes in the calibration enable state, and for generating a third calculation code in the calibration disable state, using the first and second inputs;
a calculation storage circuit suitable for storing the first calculation code and the second calculation code in the calibration enable state, the first calculation code being generated in a first mode, the second calculation code being generated in a second mode; and
a calculation controller suitable for controlling the calculation storage circuit to store the first calculation code in the first mode, and for controlling the calculation storage circuit to store the second calculation code in the second mode, in the calibration enable state.

11. The calculation code generation circuit of claim 10, wherein the sampler comprises:
   a first sampling circuit suitable for generating the first code by sampling the first value of the count code that satisfies the first preset condition; and
   a second sampling circuit suitable for generating the second code by sampling the second value of the count code, which satisfies the second preset condition.

12. The calculation code generation circuit of claim 11, wherein the first sampling circuit samples the first value of the count code, which satisfies the first preset condition, at a rising edge of the comparison signal, and
   wherein the second sampling circuit samples the second value of the count code, which satisfies the second preset condition, at a falling edge of the comparison signal.

13. The calculation code generation circuit of claim 12, wherein each of the first and second sampling circuits comprises a plurality of flip flops suitable for processing bits of the count code,
   the first sampling circuit samples the count code in synchronization with a first time point at which the comparison signal changes to a positive state, and
   the second sampling circuit samples the count code in synchronization with a second time point at which the comparison signal changes to a negative state.

14. The calculation code generation circuit of claim 11, wherein the first sampling circuit comprises a first peak detector suitable for detecting a first peak of the count code by sampling a minimum value of the count code that satisfies the first preset condition, and
   the second sampling circuit comprises a second peak detector suitable for detecting a second peak of the count code by sampling a maximum value of the count code that satisfies the second preset condition.

15. The calculation code generation circuit of claim 14, wherein the first sampling circuit compares an input count code and a first stored count code, updates the first stored count code with the input count code when the input count code is smaller than the first stored count code, and samples the input count code as the minimum value, the input count code corresponding to the first peak at which a value obtained by subtracting the first stored count code from the input count code goes negative, and
   wherein the second sampling circuit compares the input count code and a second stored count code, updates the second stored count code with the input count code when the input count code is larger than the second stored count code, and samples the input count code as the maximum value, the input count code corresponding to the second peak at which a value obtained by subtracting the second stored count code from the input count code goes positive.

16. The calculation code generation circuit of claim 10, wherein the calculator decides a center code by averaging the first and second inputs, and provides the center code as a corresponding one of the first to third calculation codes.

17. The calculation code generation circuit of claim 10, wherein the calculation storage circuit comprises a first storage circuit and a second storage circuit, the first storage circuit being suitable for storing the first calculation code generated using the first and second codes in the first mode, the second storage circuit being suitable for storing the second calculation code generated using the first and second codes in the second mode, and
   wherein the calculation controller controls the first storage circuit to store the first calculation code generated at a time when the comparison signal changes in the first mode, and controls the second storage circuit to store the second calculation code generated at a time when the comparison signal changes in the second mode.

18. The calculation code generation circuit of claim 10, wherein the calibration enable state and the calibration disable state are decided by an enable signal, which controls the counting operation.

* * * * *